(12) United States Patent  
Chang et al.

(10) Patent No.: US 7,736,989 B2
(45) Date of Patent: Jun. 15, 2010

(54) METHOD OF FORMING SEMICONDUCTOR DEVICE

(75) Inventors: Dong-Won Chang, Seoul (KR);
Sung-Nam Chang, Seoul (KR);
Seung-Gun Seo, Seoul (KR);
Dong-Seog Eun, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 18 days.

(21) Appl. No.: 12/176,618

(22) Filed: Jul. 21, 2008

(65) Prior Publication Data

US 2009/0029520 A1    Jan. 29, 2009

(30) Foreign Application Priority Data

Jul. 23, 2007    (KR) .................... 10-2007-0073616

(51) Int. Cl.
*H01L 21/762* (2006.01)
*H01L 21/28* (2006.01)
(52) U.S. Cl. .............................. 438/424; 257/E21.546; 257/E21.209
(58) Field of Classification Search ........... 438/424, 438/593, 585, 587; 257/202, 213, 288, 410, 257/E21.546
See application file for complete search history.

(56) References Cited

U.S. PATENT DOCUMENTS

| 2004/0023451 A1* | 2/2004 | Lee et al. ............. 438/201 |
| 2005/0142796 A1* | 6/2005 | Jung et al. ............ 438/413 |
| 2007/0267692 A1* | 11/2007 | Joo et al. ............. 257/330 |

FOREIGN PATENT DOCUMENTS

| JP | 10-209262 | 8/1998 |
| KR | 2004-61973 | 7/2004 |
| KR | 2004-100672 | 12/2004 |

* cited by examiner

*Primary Examiner*—Thomas L Dickey
*Assistant Examiner*—Nikolay Yushin
(74) *Attorney, Agent, or Firm*—Stanzione & Kim, LLP (57) ABSTRACT

A method of forming a semiconductor device, where the method may include forming a first trench in a semiconductor substrate, forming first device isolation patterns that fill the first trench, forming spacers on sidewalls of the first device isolation patterns, forming a second trench in the semiconductor substrate between first device isolation patterns, and forming second device isolation patterns that fill the second trench. The second trench is formed using an etching process adopting the first device isolation pattern and the spacer as a mask.

19 Claims, 10 Drawing Sheets

METHOD OF FORMING SEMICONDUCTOR DEVICE

CROSS-REFERENCE TO RELATED APPLICATIONS

This U.S. non-provisional patent application claims priority under 35 U.S.C. §119 of Korean Patent Application No. 2007-73616, filed on Jul. 23, 2007, the entire contents of which are herein incorporated by reference in their entirety.

BACKGROUND OF THE INVENTION

1. Field of the Invention

Most electronic appliances include semiconductor devices. The semiconductor devices include electronic elements such as a transistor, a resistor and a capacitor. The electronic elements are integrated on a semiconductor substrate after being designed for performing a partial function of the electronic appliances. For example, electronic appliances such as a computer or a digital camera include a memory chip for storing information and a processing chip for controlling information. The memory chip and the processing chip include the electronic elements integrated on the semiconductor substrate.

2. Description of the Related Art

In the meantime, the semiconductor devices are required to be highly integrated to meet a good performance and a low price which users expect. Conventionally, for high integration, a method of decreasing sizes of the electronic elements constituting the semiconductor devices was adopted. However, due to various technical limitations (in particular, a photolithography technical limit) during a manufacturing process of the semiconductor device, the method of decreasing sizes of the electronic elements has slowly progressed. Accordingly, a new method of forming a semiconductor device which can overcome the above technical limitations is needed to achieve the required high integration of the semiconductor device.

A double patterning technique is recently introduced as a technique that may satisfy the above technical requirement. The double patterning technique is a technique that mask patterns to form n number of patterns which are alternately arranged and are independently formed through two patterning steps. A first mask pattern and a second mask pattern are used as masks to form respective 2i-th patterns and 2i+1-th patterns (i=0~n/2). However, according to this method, the 2ith patterns and the 2i+1-th patterns may be formed to have different line widths and that may cause even-odd failure which degrades uniformity of an electrical characteristic of a semiconductor device.

SUMMARY OF THE INVENTION

Example embodiments provide a method of forming a semiconductor device. The method may include forming a first trench in a semiconductor substrate, forming first device isolation patterns that fill the first trench, forming spacers on sidewalls of the first device isolation patterns, forming a second trench in a semiconductor substrate between the first device isolation patterns, and forming second device isolation patterns that fill the second trench, wherein the second trench is formed by an etching process using the first device isolation patterns and the spacers as an etching mask.

The method may also include forming first trenches on the semiconductor substrate including a cell array region, forming first device isolation patterns that fill the first trenches, forming spacers on sidewalls of the first device isolation patterns, forming second trenches in a semiconductor substrate between the first device isolation patterns using an etching process adopting the first device isolation pattern and the spacers as an etching mask, forming second device isolation patterns that fill the second trenches, removing the spacers to expose an upper surface of the semiconductor substrate, and forming a nonvolatile memory gate structure crossing the first device isolation pattern on the semiconductor substrate on which the spacers are removed.

Additional aspects and utilities of the present general inventive concept will be set forth in part in the description which follows and, in part, will be obvious from the description, or may be learned by practice of the general inventive concept.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

The present general inventive concept now will be described more fully hereinafter with reference to the accompanying drawings, in which embodiments of the invention are illustrated. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first region/layer could be termed a second region/layer, and, similarly, a second region/layer could be termed a first region/layer without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Embodiments of the present general inventive concept may be described with reference to cross-sectional illustrations, which are schematic illustrations of idealized embodiments of the present general inventive concept. As such, variations from the shapes of the illustrations, as a result, for example, of manufacturing techniques and/or tolerances, are to be expected. Thus, embodiments of the present invention should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present general inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

In the drawings, the thickness of layers and regions are exaggerated for clarity. It will also be understood that when an element such as a layer, region or substrate is referred to as being "on" or "onto" another element, it may lie directly on the other element or intervening elements or layers may also be present. Like reference numerals refer to like elements throughout the specification.

Spatially relatively terms, such as "beneath," "below," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented (rotated 90 degrees or at other orientations) and the spatially relative descriptors used herein interpreted accordingly. As used herein, "height" refers to a direction that is generally orthogonal to the faces of a substrate.

Figure 1:
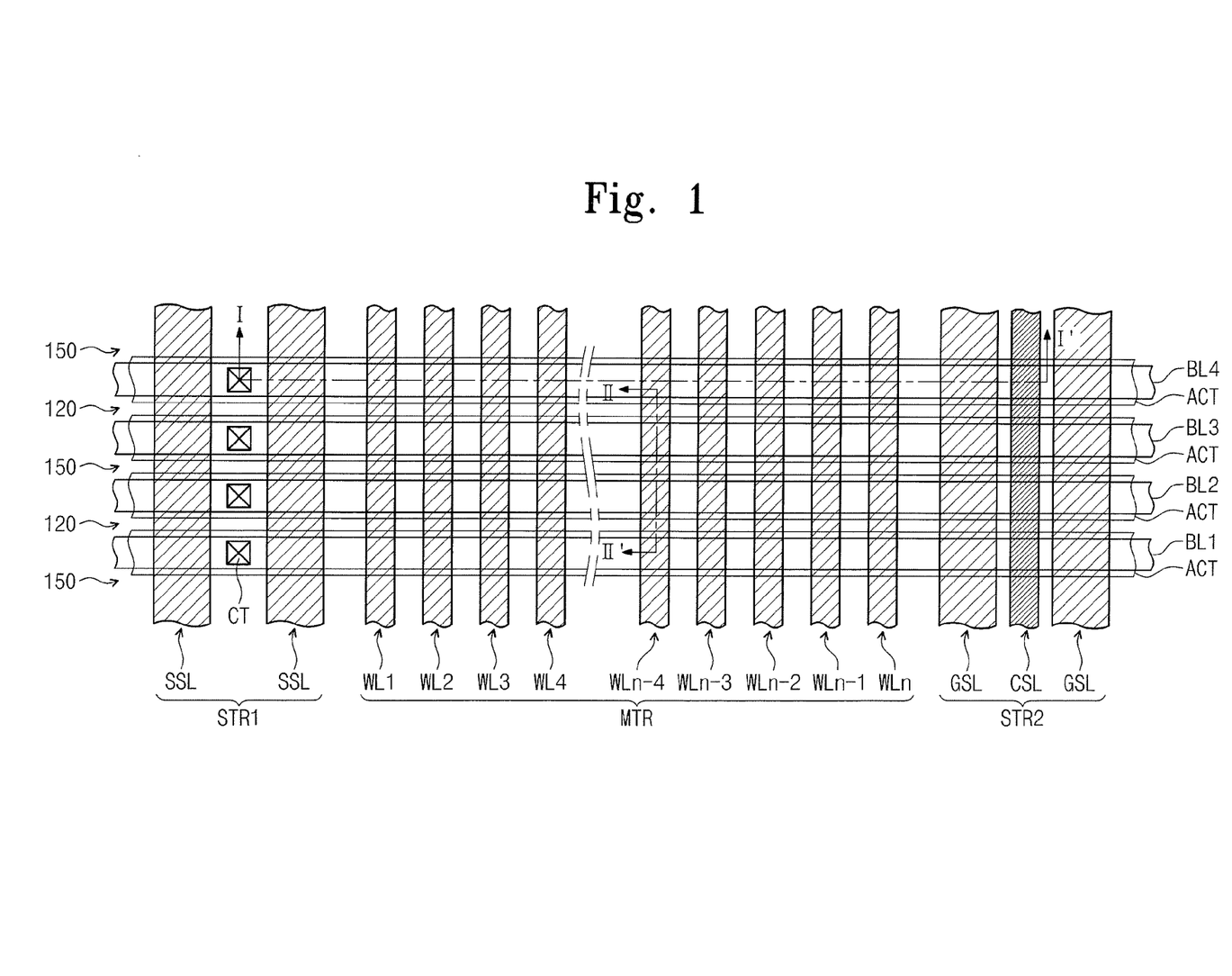
FIG. 1 is a top plan view of a semiconductor device in accordance with an embodiment of the present general inventive concept.
Figure 2A:
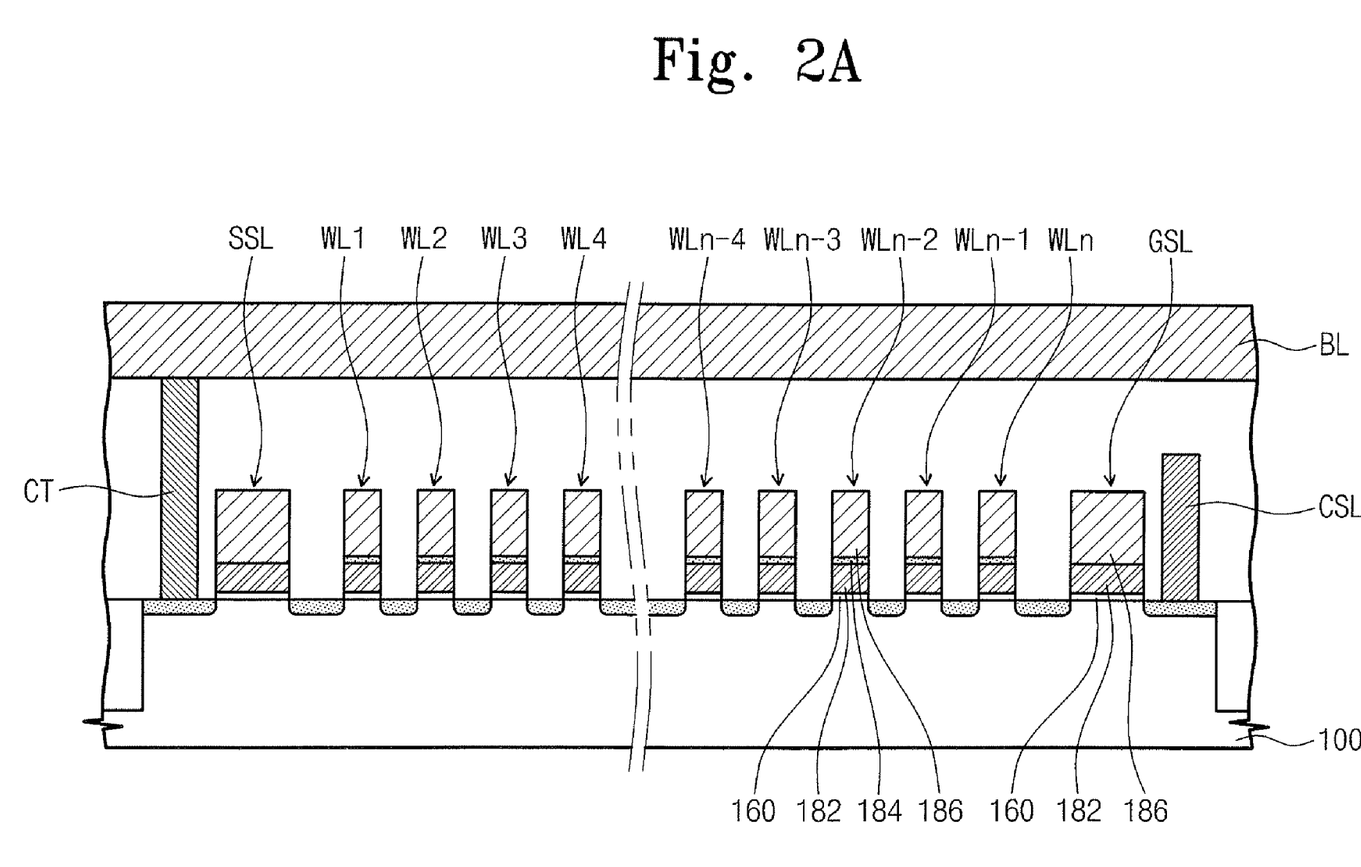
FIGS. 2A and 2B are cross sectional views of a semiconductor device in accordance with an embodiment of the present general inventive concept.
Figure 2B:
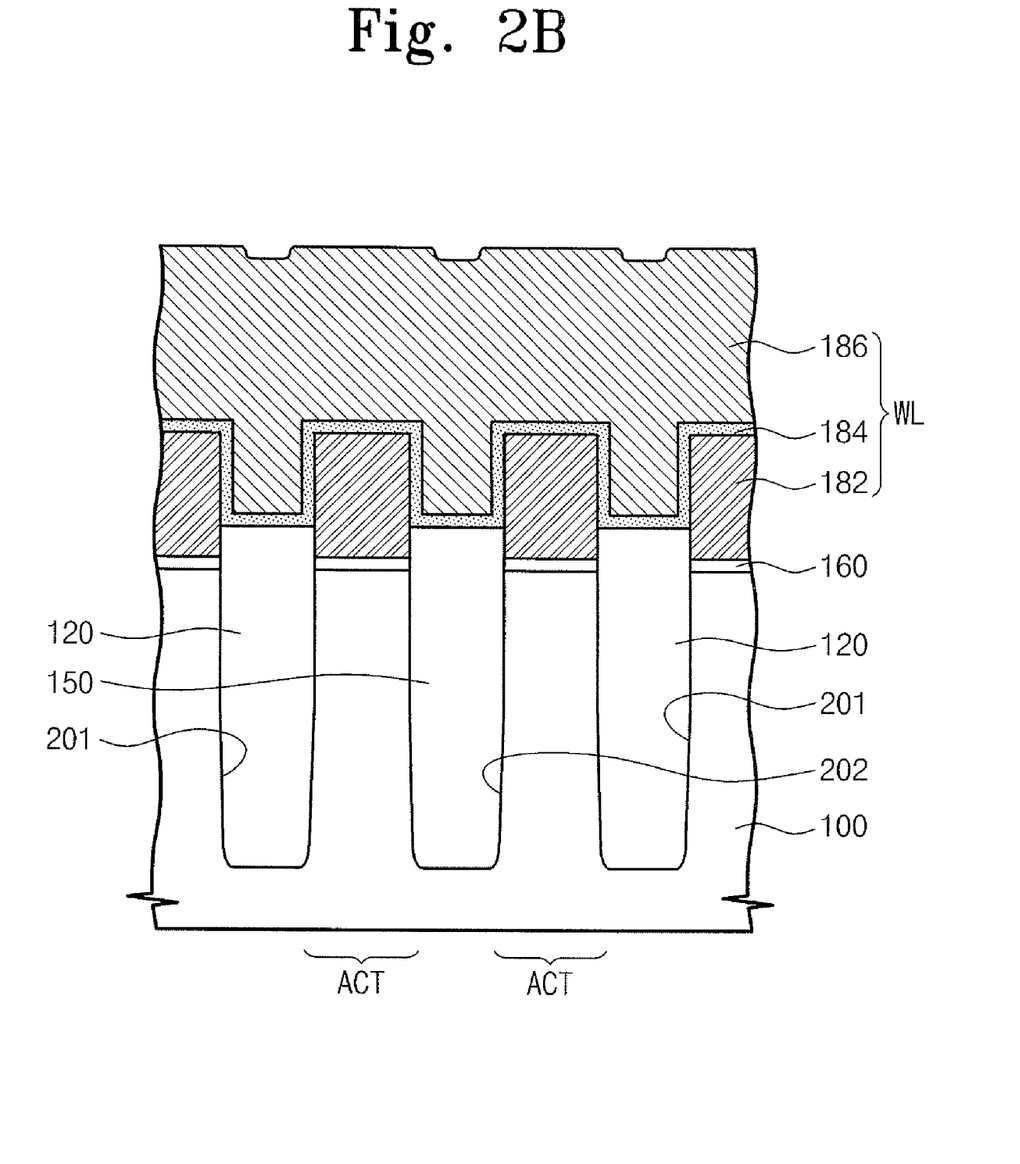

FIG. 1 is a top plan view of a semiconductor device in accordance with an embodiment of the present general inventive concept, and FIGS. 2A and 2B are cross sectional views taken along respective lines I-I' and II-II' of FIG. 1. The present embodiment addresses a NAND flash memory device and FIG. 1 illustrates a portion of a cell array region of a NAND flash memory device.

Referring to FIGS. 1, 2A and 2B, a semiconductor device 100 includes a cell array region in which memory cell transistors are disposed. First and second device isolation patterns 120 and 150 that define a cell active region ACT are disposed in the cell array region. According to the present embodiment, the first and second device isolation patterns 120 and 150 may be alternately formed. A ground selection line GSL, a string selection line SSL and a plurality of word lines WL1~WLn that cross the cell active region are disposed on the first and second device isolation patterns 120 and 150. The word lines WL1~WLn are disposed between the ground selection line GSL and the string selection line SSL. A common source line CSL that is parallel to the word lines WL1~WLn is disposed adjacent to a side of the ground selection line GSL and bit line contact plugs CT that are connected to bit lines BL1~BL4 are disposed adjacent to a side of the string selection line SSL. Consequently, the memory cells are connected to each other in series between the ground selection line GSL and the bit line BL.

According to an embodiment of the present general inventive concept, the word line WL may include a gate insulating layer 160, a floating gate electrode 182, a gate interlayer insulating pattern 184 and a control gate electrode 186 that can be sequentially stacked. The gate insulating layer 160 may be formed of any one of a silicon oxide layer, a silicon nitride layer, a silicon oxynitride layer and a high dielectric layer. The high dielectric layer may include $Al_2O_3$, $Al_xSi_yO_z$, $(Ba, Sr)TiO_3$, $BeAl_2O_4$, $CeO_2$, $CeHfO_4$, $CoTiO_3$, $Si_3N_4$, $EuAlO_3$, $HfO_2$, Hf silicate, $La_2O_3$, $LaScO_3$, $La_2SiO_5$, $MaAl_2O_4$, $NdAlO_3$, $PrAlO_3$, $SmAlO_3$, $SrTiO_3$, $Ta_2O_5$, $TiO_2$, $Y2O_3$, $Y_xSi_yO_z$, $ZrO_2$, Zr silicate, Zr-AL-O and $(Zr, Sn)TiO_4$. The floating gate electrode 182 may be polysilicon layer formed using a chemical vapor deposition (CVD) process. The gate interlayer insulating pattern 184 may be formed of at least one selected from a group consisting of a silicon nitride layer and a silicon oxide layer. It is an exemplary embodiment that the gate interlayer insulating pattern 184 is formed of a silicon oxide layer, a silicon nitride layer and a silicon oxide layer that are sequentially stacked. The control gate electrode 186 may include at least one of a polysilicon layer, a metal layer and a silicide layer. For example, the control gate electrode 186 may be a polysilicon layer and a silicide layer that are sequentially stacked. The common source line CSL, the bit line contact plugs CT and the bit line BL may be formed of one material of W, WN, Ti, TiN, TaN, Cu and silicon layers or combinations thereof.

FIGS. 3 to 10 are cross sectional views illustrating a method of forming a semiconductor device in accordance with an embodiment of the present general inventive concept.

Figure 3:
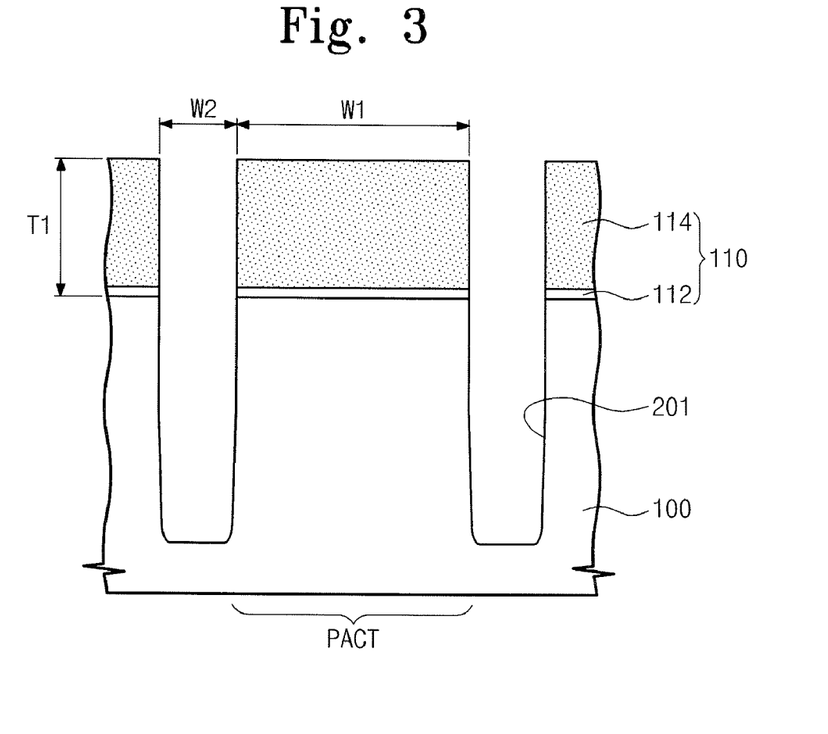
FIGS. 3 to 10 are cross sectional views illustrating a method of forming a semiconductor device in accordance with an embodiment of the present general inventive concept.

Referring to FIG. 3, after a trench mask pattern 110 is formed on a semiconductor substrate 100, the semiconductor substrate 100 is etched using the trench mask pattern 110 as an etching mask to form first trenches 201 that define a preliminary active region PACT.

The trench mask pattern 110 may include a lower mask pattern 112 and an upper mask pattern 114. According to an embodiment of the present general inventive concept, the lower mask pattern 112 maybe formed of a silicon oxide layer and the upper mask pattern 114 may be formed of a silicon nitride layer. Since a thickness T1 of the trench mask pattern 110 determines heights of first and second device isolation patterns which are formed in a subsequent process, the trench mask pattern 110 is formed to have a thickness that considers a required height of the first and second device isolation patterns. A thickness T1 of the trench mask pattern 110 may be about 50 nm ~5000 nm.

A depth of the first trench 201 may be about 200 nm~500 nm from an upper surface of the semiconductor substrate 100. It is an exemplary embodiment that the first trench 201 is formed using an anisotropic etching process. A width of the first trench 201 is less than a width of the preliminary active region PACT defined by the first trench 201. The width of the preliminary active region PACT may be about three times as great as a width W2 of the first trench 201.

Figure 4:
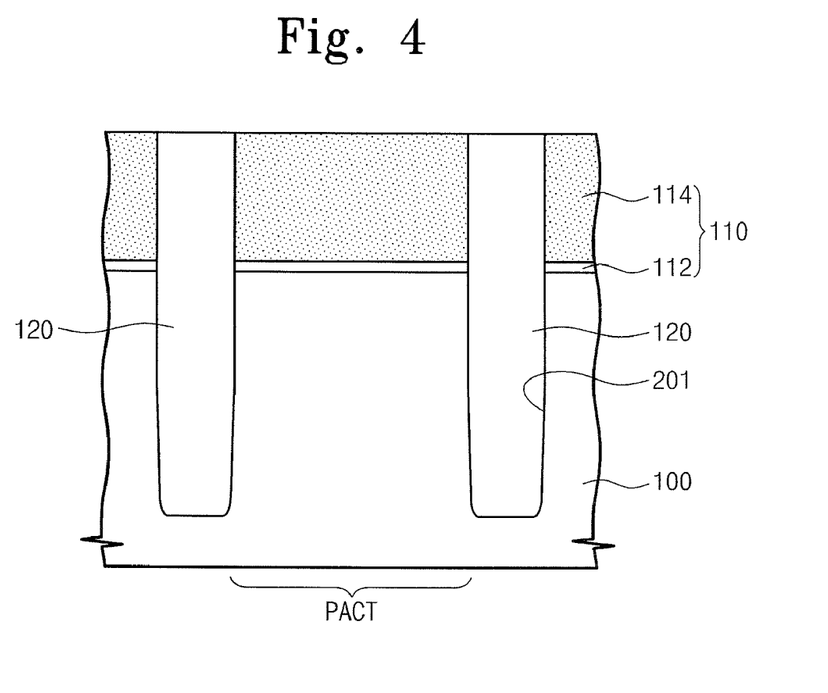

Referring to FIG. 4, a first device isolation pattern 120 filling the first trench 201 is formed. The first device isolation pattern 120 is formed of a silicon oxide layer and may further include at least one of a silicon nitride layer, a polysilicon layer, a silicon-germanium layer and a spin on glass (SOG) layer.

In detail, forming the first device isolation pattern 120 may further include forming the first device isolation layer (not shown) on the semiconductor substrate 100 in which the first trench 201 is formed and etching the first device isolation layer to expose an upper surface of the trench mask pattern 110.

The first device isolation layer may include a liner layer that conformally covers the semiconductor substrate 100 in which the first trench 201 is formed and a buried insulating layer which fills the first trench in which the liner layer is formed. The liner layer may be a silicon nitride layer formed using a chemical vapor deposition (CVD) process and the buried insulating layer may be a silicon oxide layer formed using a chemical vapor deposition (CVD) process. According to a modified embodiment, the buried insulating layer may be at least one of a polysilicon layer, a silicon-germanium layer and a spin on glass (SOG) layer. In addition, before the liner layer is formed, forming the first device isolation layer may further include thermal oxidizing silicon atoms of the semiconductor substrate 100 exposed through the first trench 201. In this case, a thermal oxidation layer (not shown) may be further formed between the semiconductor substrate 100 and the liner layer.

In the meantime, an etching process having an etching selectivity with respect to the trench mask pattern 110 may be used to etch the first device isolation layer. According to an embodiment herein, the etching process may be performed using a chemical-mechanical polishing (CMP) process.

Figure 5:
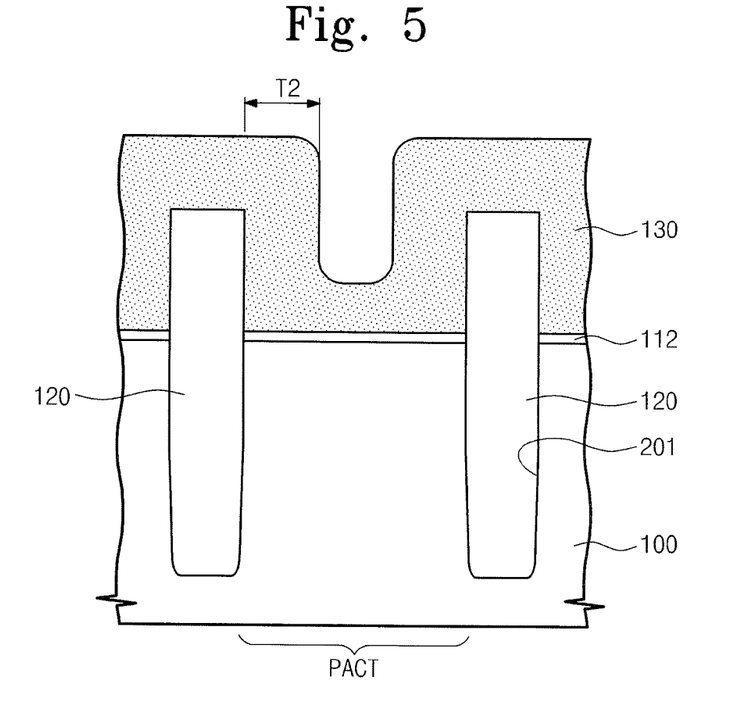

Referring to FIG. 5, the upper mask pattern 114 of the trench mask pattern 110 is removed and a spacer layer 130 is formed on the semiconductor substrate 100 on which the upper mask pattern 114 is removed.

According to alternative embodiments herein, only the upper mask pattern 114 may be selectively removed or both the upper mask pattern 114 and the lower mask pattern 112 may be removed. In the case where the upper mask pattern 114 and the lower mask pattern 112 are both removed, to thus expose the underlying preliminary active region PACT, a silicon oxide layer may be formed on the exposed upper surface of the preliminary active region PACT.

The spacer layer 130 is formed to cover a sidewall of the first device isolation pattern 120 exposed by removing the trench mask pattern 110 (or only the upper mask layer 114 of the trench mask pattern 110). Forming the spacer layer 130 may be performed using at least one of a chemical vapor deposition technique and an atomic layer deposition technique. The spacer layer 130 may be formed to have a conformal thickness of T2 on the semiconductor substrate on which the trench mask pattern 110 is removed.

Figure 6:
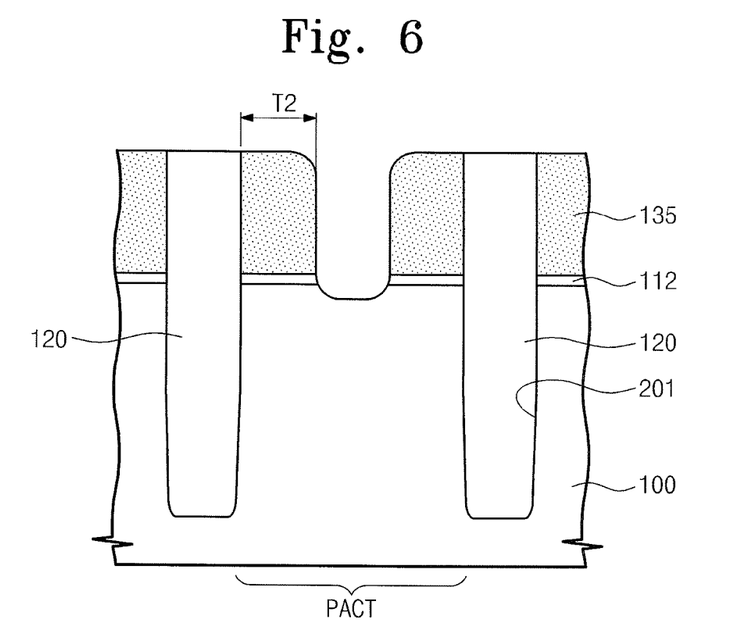

Referring to FIG. 6, the spacer layer 130 is anisotropically etched to form spacers 135 that expose a center of the preliminary active region PACT. The spacers 135 are formed on both sides of the first device isolation pattern 120 so that an upper surface of the first device isolation pattern 120 is exposed.

As described above, since the spacer layer 130 is formed to have a conformal thickness and the spacers 135 are formed by anisotropically etching the spacer layer 130, the spacers 135 are formed to have substantially the same width T2 regardless of where the spacers 135 are located.

The spacer layer 130 may be etched using a first etch recipe having an etching selectivity with respective to the semiconductor substrate 100.

Figure 7:
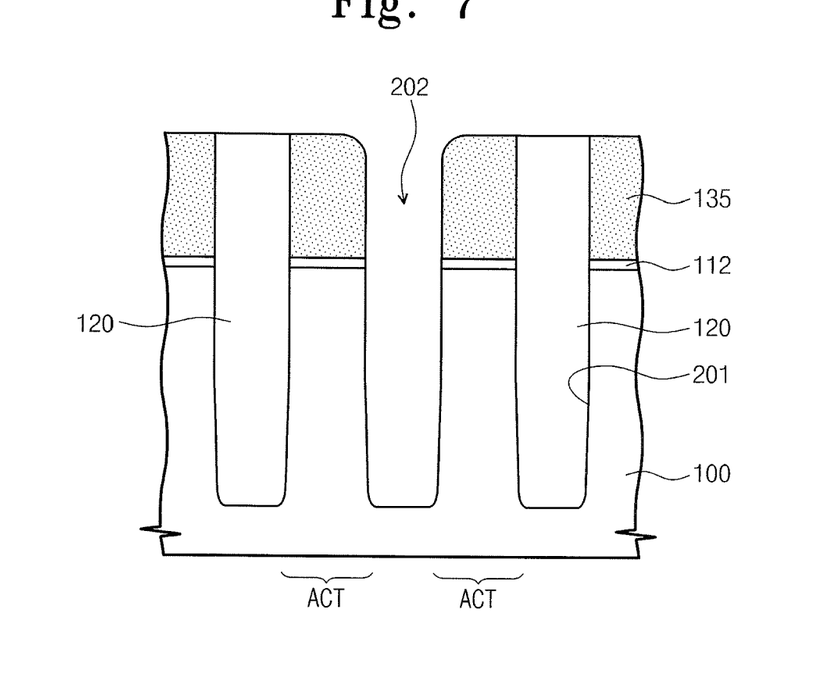

Referring to FIG. 7, the exposed preliminary active region PACT is anisotropically etched using the spacers 135 and the first device isolation patterns 120 as an etching mask to form second trenches 202 that define active regions ACT between the first device isolation patterns 120.

The second trenches 202 are formed using a second etch recipe having an etching selectivity with respect to the spacers 135 and the first device isolation patterns 120. The second trenches 202 may be formed to have substantially the same width and depth as the first trenches 201.

According to embodiments of the present general inventive concept, the spacers 135 are formed on both sidewalls of the first device isolation patterns 120 which fill the first trench 201. The spacers 135 are self-aligned with both sidewalls of the first device isolation patterns 120. The second trench 202 is formed between the spacers 135. The second trench 202 is self-aligned with the spacers 135. In addition, since widths of the spacers 135 are determined by a thickness of the spacer layer 130 conformally formed using a deposition process, the widths of the spacers 135 are substantially the same regardless of where the spacers 135 are located. Thus, the active regions ACT may be formed to have substantially the same widths (i.e., a distance between the first device isolation pattern and the second device isolation pattern adjacent to the first device isolation pattern) regardless of where the active regions ACT are located.

Figure 8:
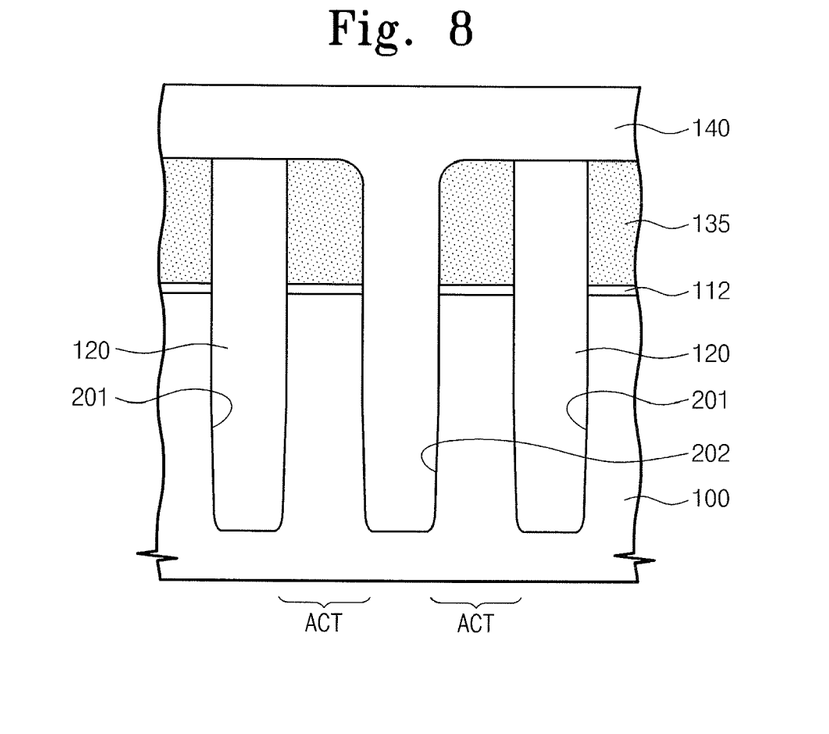
Figure 9:
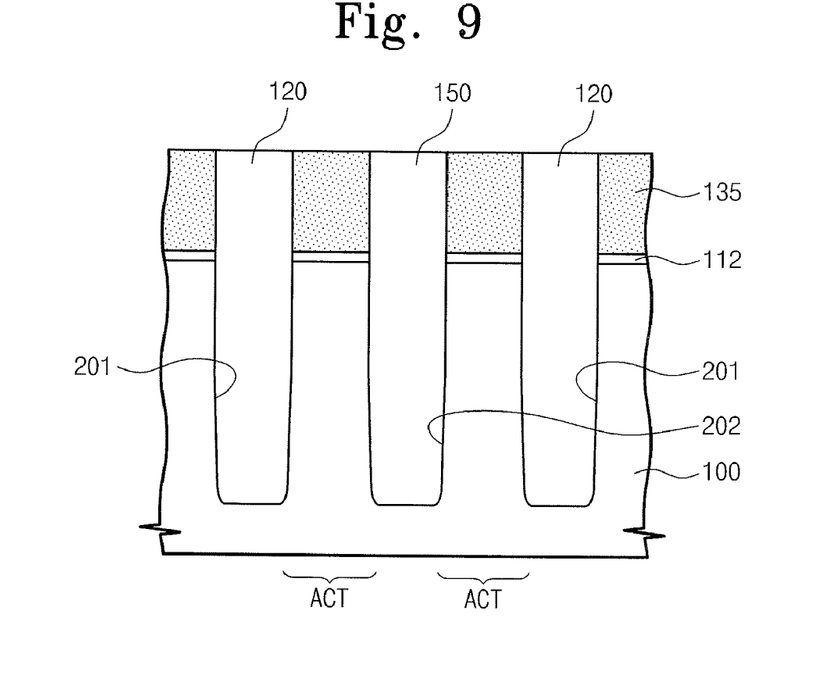

Referring to FIGS. 8 and 9, after forming a second device isolation layer 140 on the semiconductor substrate 100 including the second trench 202, the second device isolation layer 140 is etched to form second device isolation patterns 150 that fill the second trench 202.

The second device isolation layer 140 may be formed using the same method as the first device isolation layer. The second device isolation layer 140 may also be formed of the same material as the first device isolation layer. That is, the second device isolation layer 140 may include at least one of a thermal oxide layer, a liner layer and a buried insulating layer, and a method of forming the second device isolation layer 140 and material of the second device isolation layer 140 may be the same as the first device isolation layer.

The second device isolation patterns 150 may be formed using an etching process having an etching selectivity with respect to the spacers 135. The etching process may be performed using a chemical mechanical polishing (CMP) process.

Figure 10:
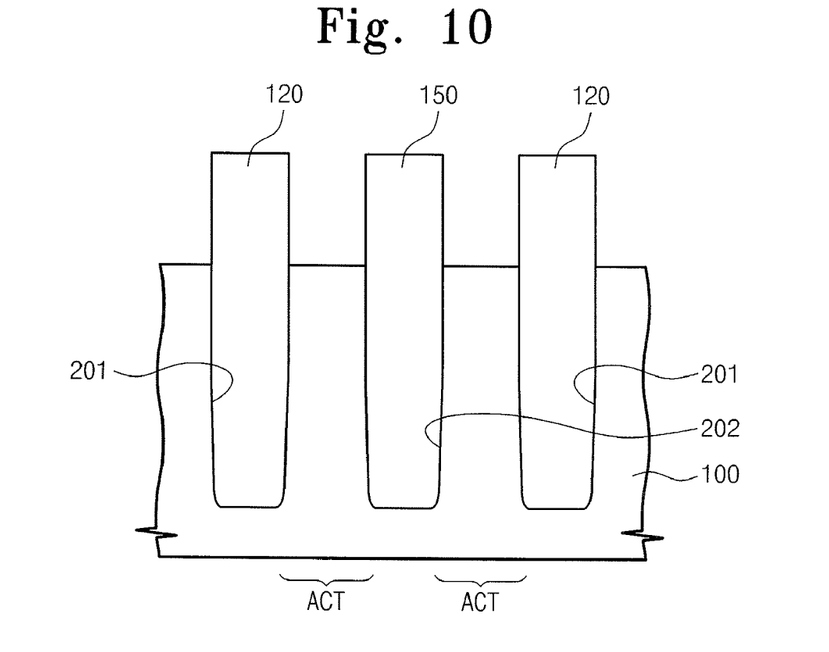

Referring to FIG. 10, the spacers 135 are removed to expose an upper surface of the active region ACT. The spacers 135 may be removed using a wet etching process having an etching selectivity with respect to the first and second device isolation patterns 120 and 150. For example, in a case that the spacers 135 are formed of a silicon nitride layer, an etching solution including phosphoric acid may be used.

In a case that the lower mask layer 112 remains on the semiconductor substrate 100, a step of removing the spacers 135 may further include a step of removing the lower mask layer 112. The lower mask layer 112 may be removed using a wet etching process having an etching selectivity with respect to the semiconductor substrate 100. In this case, sidewalls of the first and second device isolation patterns 120 and 150 which upwardly protrude from the upper surface of the semiconductor substrate 100 may be recessed. That is, widths of upper portions of the first and second device isolation patterns 120 and 150 which upwardly protrude from the upper surface of the semiconductor substrate 100 may be less than widths of lower portions of the first and second device isolation patterns 120 and 150 which are buried in the first and second trenches 201 and 202.

FIGS. 11 to 14 are cross sectional views illustrating a method of forming a semiconductor device in accordance with another embodiment of the present general inventive concept. The present embodiment addresses a cell array region of a flash memory device and a method of forming an active region and is similar to the method of the embodiment described in FIGS. 3 to 10. Thus, descriptions of overlapped parts with the aforementioned embodiment may be omitted.

According to the present embodiment, active regions limited by the first and second device isolation patterns 120 and 150 are formed using the method described in FIGS. 3 to 10. The semiconductor substrate 100 includes a cell array region in which memory cell transistors are disposed and a peripheral region in which peripheral circuits are disposed. The first and second device isolation patterns 120 and 150 are alternately formed in the cell array region. In addition, the first and second device isolation patterns 120 and 150 are not only formed in a rectangular shape (i.e., line shape) but also disposed parallel to each other. One of the first and second device isolation patterns 120 and 150 may be formed in the peripheral region.

As described above, the first and second device isolation patterns 120 and 150 upwardly protrude from the upper surface of the semiconductor substrate 100 to form a gap region on the active region ACT. Since the first and second device isolation patterns 120 and 150 are formed to have a line shape, the gap region has also a line shape.

Figure 11:
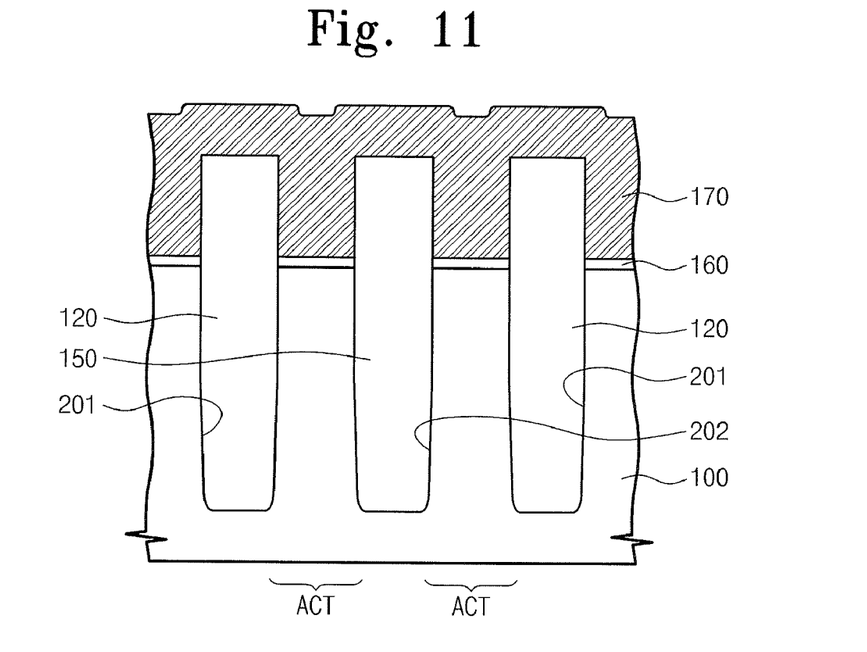
FIGS. 11 to 14 are cross sectional views illustrating a method of forming a semiconductor device in accordance with another embodiment of the present general inventive concept.
Figure 12:
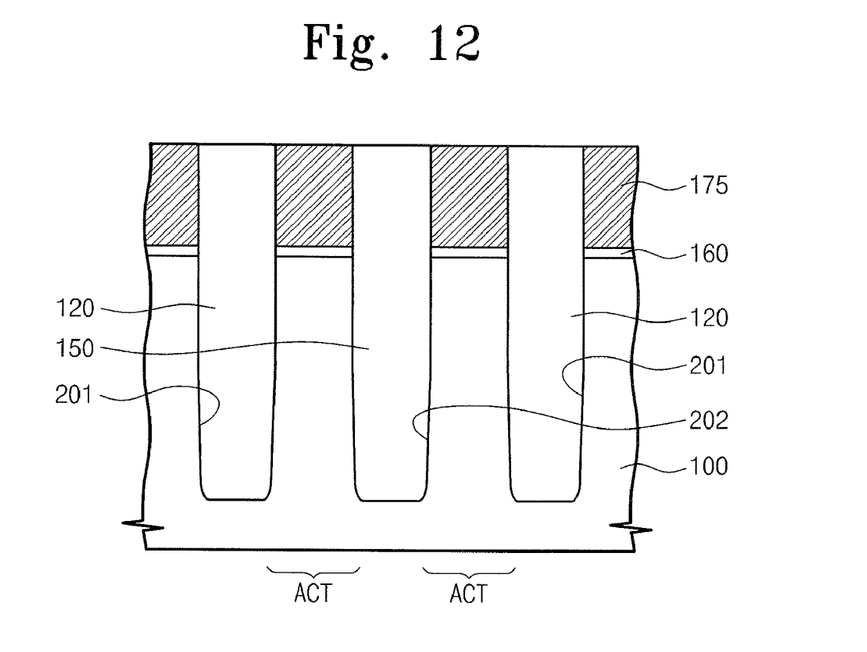

Referring to FIGS. 11 and 12, a gate insulating layer 160 that covers an upper surface of the active region ACT is formed on the semiconductor substrate 100 on which the spacers 135 are removed. The gate insulating layer 160 may be a silicon oxide layer formed by thermal oxidizing the upper surface of the active region ACT. However, a type of the gate insulating layer 160 and a method of forming the gate insulating layer 160 may be variously changed. The gate insulating layer 160 may be at least one of a silicon oxide layer, a silicon nitride layer, a silicon oxynitride layer, an aluminum oxide layer and a hafnium oxide layer.

Subsequently, a floating gate layer 170 that fills the gap region is formed. The floating gate layer 170 may be formed of a conductive material (for example, a polysilicon layer).

Referring to FIG. 12, the floating gate layer 170 is etched back to expose the upper surface of the first and second device isolation patterns 120 and 150. A floating gate pattern 175 that fills the gap region may be formed. The floating gate pattern 175 is self-aligned between the first and second device isolation patterns 120 and 150.

The floating gate layer 170 may be etched back using a chemical mechanical polishing (CMP) process. As described above, since the gap region is formed to have a line shape, the floating gate pattern 175 that fills the gap region may also have a line shape parallel to the first and second device isolation patterns 120 and 150. In addition, widths of upper portions of the first and second device isolation patterns 120 and 150 which upwardly protrude from the upper surface of the semiconductor substrate 100 may be less than widths of lower portions of the first and second device isolation patterns 120 and 150 which are buried in the first and second trenches 201 and 202. The floating gate pattern 175 which fills the gap region may be formed to have a width greater than the active region ACT.

Figure 13:
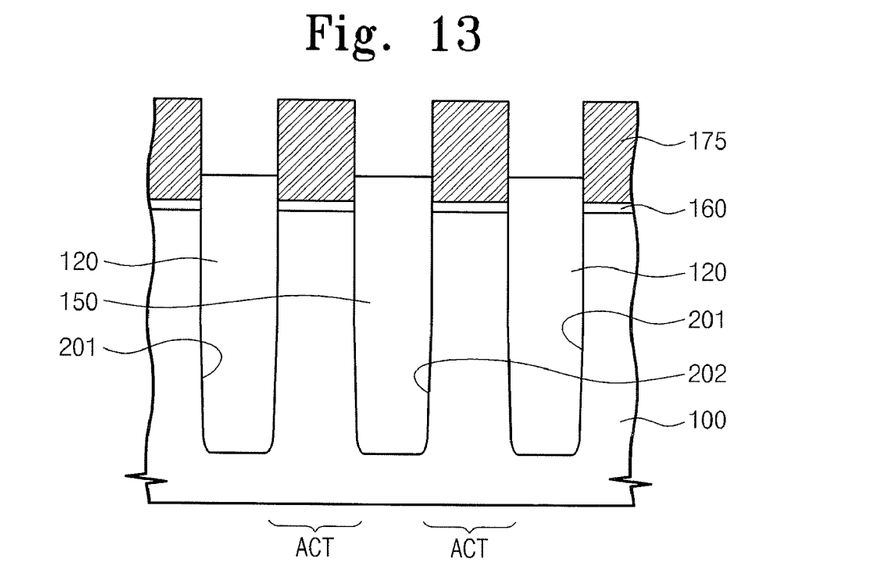
Figure 14:
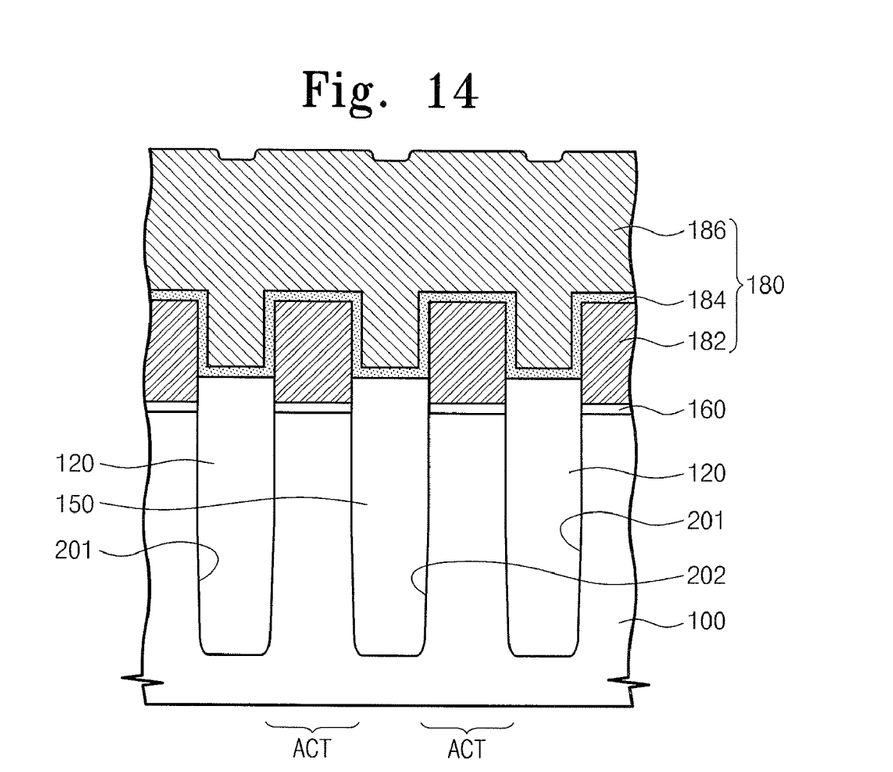

Referring to FIGS. 13 and 14, the upper surfaces of the first and second device isolation patterns 120 and 150 are etched so that the upper surfaces of the first and second device isolation patterns 120 and 150 are lower than an upper surface of the floating gate pattern 175.

A gate interlayer insulating layer and a control gate layer are sequentially formed on the semiconductor substrate 100 including the recessed first and second device isolation patterns 120 and 150. The gate interlayer insulating layer may include at least one of a silicon oxide layer and a silicon nitride layer. The gate interlayer insulating layer may be silicon oxide layer-silicon nitride layer-silicon oxide layer that are sequentially stacked. The control gate layer may include at least one of conductive materials. The control gate layer may include a polysilicon layer and a silicide layer that are sequentially stacked.

The control gate layer, the gate interlayer insulating layer and the floating gate pattern 175 are patterned to form word lines crossing over the active region and floating gates between the word lines and the active region. The gate insulating layer 160 is exposed during patterning of the control gate layer, the gate interlayer insulating layer and the floating gate pattern 175. Therefore, a gate electrode 180 including a floating gate electrode 182, a gate interlayer insulating pattern 184 and a control gate electrode 186 that are sequentially stacked are formed in a direction which crosses the first and second device isolation patterns 120 and 150.

Figure 15:
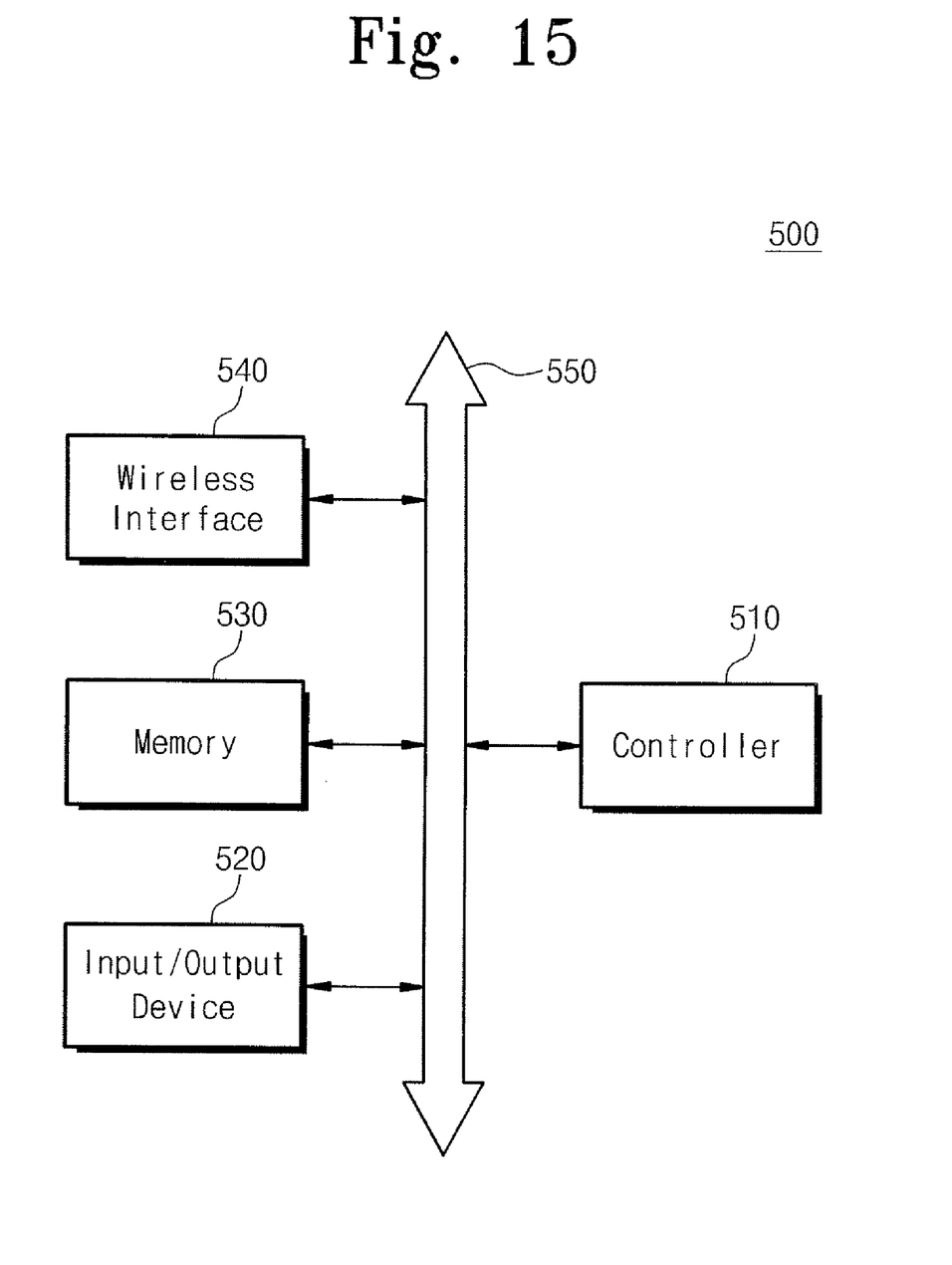
FIG. 15 is a drawing illustrating electronic devices including a semiconductor device in accordance with the present general inventive concept.

FIG. 15 is a drawing illustrating electronic devices including a semiconductor device in accordance with the present general inventive concept.

Referring to FIG. 15, an electronic device 500 including the semiconductor device in accordance with some embodiments of the present general inventive concept may be used in a wireless communication such as PDA, a laptop computer, a portable computer, a web tablet, a wireless telephone, a cell phone, a digital music player, or a memory card or all devices that can transmit and/or receive information.

The electronic device 500 may include a controller 510, an input/output device 520, a memory 530 and a wireless interface 540 which are combined with each other through a bus 550. The controller 510 may include at least one microprocessor, at least one digital signal processor, at least one micro controller or the like. The input/output device 520 may include, for example, a key pad, a key board, a display. The memory 530 may be used to store instructions executed by the controller 510. The memory 530 may be used to store user data. The memory 530 may include the semiconductor device according to some embodiments of the present invention. The memory 530 may also further include a different kind of memory, a volatile memory which is capable of randomly accessing, and various kinds of memories.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method of forming a semiconductor device, comprising:
   forming a first trench in a semiconductor substrate;
   forming first device isolation patterns that fill the first trench;
   forming spacers on sidewalls of the first device isolation patterns;
   forming a second trench in a semiconductor substrate between the first device isolation patterns;
   forming second device isolation patterns that fill the second trench;
   removing the spacers to expose an upper surface of the semiconductor substrate;
   forming a gate insulating layer on an upper surface of the exposed semiconductor substrate; and
   forming a gate electrode on the semiconductor substrate including the gate insulating layer,
   wherein the second trench is formed using an etching process adopting the first device isolation patterns and the spacers as an etching mask.

2. The method of claim 1, wherein the forming the first trench comprises:
   forming a trench mask pattern on the semiconductor substrate; and
   defining a preliminary active region by etching the semiconductor substrate using the trench mask pattern as an etching mask,
   wherein the trench mask pattern is formed to have the same width as the sum of a width of the second device isolation pattern and widths of the spacers disposed on both sidewalls of the second device isolation pattern.

3. The method of claim 2, wherein the forming the first device isolation pattern comprises:
   forming a first device isolation layer that fills the first trench;
   etching the first device isolation layer to expose an upper surface of the trench mask pattern; and
   removing the trench mask pattern to expose an upper sidewall of the first device isolation pattern.

4. The method of claim 1 wherein the second device isolation patterns are formed to have substantially the same width as the first device isolation patterns.

5. The method of claim 1, wherein the forming the second device isolation pattern comprises:
   forming a second device isolation layer that fills the second trench; and
   etching the second device isolation layer to expose an upper surface of the spacers,
   wherein the second device isolation pattern is formed of substantially the same material as the first device isolation pattern.

6. The method of claim 1, wherein the semiconductor substrate comprises a cell array region and a peripheral circuit region, and
   wherein the first and second device isolation patterns are alternately formed in the cell array region and one of the first device isolation pattern and the second device isolation pattern is formed in the peripheral circuit region.

7. The method of claim 1, wherein the forming the gate electrode comprises:
   forming a floating gate pattern covering the semiconductor substrate on the gate insulating layer, a floating gate pattern having a major axis parallel to the first device isolation pattern;
   forming a gate interlayer insulating layer and a control gate layer on the semiconductor substrate including the floating gate pattern; and
   sequentially patterning the control gate layer, the gate interlayer insulating layer and the floating gate pattern to form the gate electrode crossing the first device isolation pattern,
   wherein the gate electrode includes a floating gate electrode, a gate interlayer insulating pattern and a control gate electrode that are sequentially stacked.

8. The method of claim 7, wherein the forming the floating gate pattern comprises:
   forming a floating gate layer on the semiconductor substrate including the gate insulating layer; and
   etching the floating gate layer to expose an upper surface of the first and second device isolation patterns, thereby forming the floating gate pattern self-aligned between the first and second device isolation patterns.

9. The method of claim 8, after etching the floating gate layer, further comprising etching the upper surface of the exposed first and second device isolation patterns.

10. A method of forming a semiconductor device, comprising:
    forming a first trench in a semiconductor substrate;
    forming first device isolation patterns that fill the first trench;
    forming spacers on sidewalls of the first device isolation patterns;
    forming a second trench in a semiconductor substrate between the first device isolation patterns; and
    forming second device isolation patterns that fill the second trench,
    wherein the second trench is formed using an etching process adopting the first device isolation patterns and the spacers as an etching mask,
    the forming the spacers comprises:
       forming a spacer layer on the semiconductor substrate including the first device isolation pattern; and
       anisotropically etching the spacer layer to expose an upper surface of the semiconductor substrate, and
    the spacer layer is formed to have substantially the same thickness as a distance between the first device isolation pattern and the second device isolation pattern.

11. A method of forming a semiconductor device, comprising:
    forming a first trench in a semiconductor substrate;
    forming first device isolation patterns that fill the first trench;
    forming spacers on sidewalls of the first device isolation patterns;
    forming a second trench in a semiconductor substrate between the first device isolation patterns; and
    forming second device isolation patterns that fill the second trench,
    wherein the second trench is formed using an etching process adopting the first device isolation patterns and the spacers as an etching mask, and
    the second device isolation patterns are formed to have substantially the same depth as the first device isolation patterns.

12. A method of forming a semiconductor device, comprising:
    forming a first trench in a semiconductor substrate;
    forming first device isolation patterns that fill the first trench;
    forming spacers on sidewalls of the first device isolation patterns;

forming a second trench in a semiconductor substrate between the first device isolation patterns; and forming second device isolation patterns that fill the second trench, wherein the second trench is formed using an etching process adopting the first device isolation patterns and the spacers as an etching mask, the spacers are formed by depositing a spacer layer and anisotropically etching the spacer layer, thereby being self-aligned with both sides of the first device isolation pattern, the second trenches are formed using the spacers self-aligned with the first device isolation pattern as an etching mask, thereby being self-aligned between the spacers, and the second device isolation patterns fill the second trench which is self-aligned between the spacers, so that a distance between the first device isolation pattern and the second device isolation pattern adjacent to the first device isolation pattern is substantially the same regardless of where the first device isolation pattern is located.

13. A method of forming a semiconductor device, comprising:

forming first trenches on the semiconductor substrate including a cell array region;

forming first device isolation patterns that fill the first trenches;

forming spacers on sidewalls of the first device isolation patterns;

forming second trenches in a semiconductor substrate between the first device isolation patterns using an etching process adopting the first device isolation pattern and the spacers as an etching mask;

forming second device isolation patterns that fill the second trenches;

removing the spacers to expose an upper surface of the semiconductor substrate; and forming a nonvolatile memory gate structure crossing the first device isolation pattern on the semiconductor substrate on which the spacers are removed.

14. The method of claim 13, wherein the forming the first trench comprises:

forming a trench mask pattern on the semiconductor substrate; and defining a preliminary active region by etching the semiconductor substrate using the trench mask pattern as an etching mask, wherein the trench mask pattern is formed to have the same width as sum of a width of the second device isolation pattern and widths of spacers disposed on both sidewalls of the second device isolation pattern.

15. The method of claim 13, wherein forming the spacers comprises:

forming a spacer layer on the semiconductor substrate including the first device isolation pattern; and anisotropically etching the spacer layer to expose an upper surface of the semiconductor substrate, wherein the spacer layer is formed to have substantially the same thickness as a distance between the first device isolation pattern and the second device isolation pattern.

16. The method of claim 13, wherein the second trenches are formed to have substantially the same depth as the first trenches.

17. The method of claim 13, wherein the second trenches are formed to have substantially the same width as the first trenches.

18. The method of claim 13, wherein the spacers are formed by depositing a spacer layer and anisotropically etching the spacer layer, thereby being self-aligned with both sides of the first device isolation pattern, wherein the second trenches are formed using the spacers self-aligned with the first device isolation pattern as an etching mask, thereby being self-aligned between the spacers, and wherein the second device isolation patterns fill the second trench which is self-aligned between the spacers, so that a distance between the first device isolation pattern and the second device isolation pattern adjacent to the first device isolation pattern is substantially the same regardless of where the first device isolation pattern is located.

19. The method of claim 13, wherein the forming a nonvolatile memory gate structure comprises:

forming a gate insulating layer on the semiconductor substrate exposed by removing the spacers;

forming a floating gate layer on the semiconductor substrate including the gate insulating layer;

etching the floating gate layer down to upper surfaces of the first and second device isolation patterns to form the floating gate pattern self-aligned between the first and second device isolation patterns;

forming a gate interlayer insulating layer and a control gate layer on the semiconductor substrate including the floating gate pattern; and sequentially patterning the control gate layer, the gate interlayer insulating layer and the floating gate pattern to form the gate electrode crossing the first device isolation pattern.

* * * * *

UNITED STATES PATENT AND TRADEMARK OFFICE
CERTIFICATE OF CORRECTION

PATENT NO. : 7,736,989 B2  Page 1 of 1
APPLICATION NO. : 12/176618
DATED : June 15, 2010
INVENTOR(S) : Dong-Won Chang et al.

It is certified that error appears in the above-identified patent and that said Letters Patent is hereby corrected as shown below:

On the Title Page Item (54) and Col. 1, lines 1-2

"METHOD OF FORMING SEMICONDUCTOR DEVICE", should read as "METHODS OF FORMING SEMICONDUCTOR DEVICE"

Signed and Sealed this

Fifth Day of October, 2010

David J. Kappos
*Director of the United States Patent and Trademark Office*